(12) United States Patent
Chujo et al.

(10) Patent No.: US 7,786,751 B2
(45) Date of Patent: Aug. 31, 2010

(54) DIFFERENTIAL SIGNALING SYSTEM AND METHOD OF CONTROLLING SKEW BETWEEN SIGNAL LINES THEREOF

(75) Inventors: Norio Chujo, Tokyo (JP); Satoshi Muraoka, Yokohama (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 11/831,087

(22) Filed: Jul. 31, 2007

(65) Prior Publication Data
US 2008/0030242 A1 Feb. 7, 2008

(30) Foreign Application Priority Data
Aug. 2, 2006 (JP) .............................. 2006-210909

(51) Int. Cl.
*H03K 17/16* (2006.01)
*H03K 19/003* (2006.01)
(52) U.S. Cl. .............................. 326/27; 326/21; 326/86
(58) Field of Classification Search .................. 326/68, 326/82, 83, 86, 87; 327/108, 109; 375/295–315, 375/327, 330–331; 439/620.22
See application file for complete search history.

(56) References Cited

U.S. PATENT DOCUMENTS

| | | | | |
|---|---|---|---|---|
| 4,481,641 A | * | 11/1984 | Gable et al. | 375/220 |
| 5,495,186 A | * | 2/1996 | Kanazawa et al. | 326/83 |
| 6,538,483 B2 | * | 3/2003 | Natsume | 327/144 |
| 2004/0212404 A1 | * | 10/2004 | Shizuki | 327/108 |
| 2007/0046335 A1 | * | 3/2007 | Becker et al. | 326/93 |

FOREIGN PATENT DOCUMENTS

JP 2002-374312 12/2002

* cited by examiner

*Primary Examiner*—Rexford N Barnie
*Assistant Examiner*—Jany Tran
(74) *Attorney, Agent, or Firm*—Antonelli, Terry, Stout & Kraus, LLP.

(57) ABSTRACT

The present invention provides a differential signaling system comprising: a driver circuit that transmits a differential signal; a receiver circuit that receives the differential signal; and two or more signal lines used for the differential signal to be transmitted by the driver circuit and received by the receiver circuit, wherein the driver circuit gives an arbitrary time lag between the two signals that form the differential signal before transmitting them.

14 Claims, 13 Drawing Sheets

DIFFERENTIAL SIGNALING SYSTEM AND METHOD OF CONTROLLING SKEW BETWEEN SIGNAL LINES THEREOF

BACKGROUND OF THE INVENTION

1. Field of the Invention

The present invention relates to a differential signaling system which uses at least two signal wires to connect a driver circuit and a receiver circuit and transmits a small amplitude signal between at high rates of several hundred Mbps or higher. The invention also relates to a method of controlling the skew between the signal lines of such a differential signaling system, and to a connectorized cable and an information processing apparatus each of which is provided with such a differential signaling system.

2. Description of the Related Art

Due to high immunity to noise, especially to common mode noise, transmission of a differential signal by using two signal wires is commonly employed for transmitting a small amplitude signal at high rates of several hundred Mbps or higher.

However, differential signaling poses a problem that raising the transmission rate increases the effect of the propagation delay difference (skew) between the two signal lines. For example, a twisted pair cable as shown in FIG. 2 may have skew of 10 ps/m or more. If the transmission rate is 10 Gbps and the length is 5 m, signal reception is difficult at the receiver circuit since one signal shifts from the other signal by half of the time period of the signal.

In JP-A-2002-374312 (Patent Document 1), a variable delay circuit is provided on the input of the differential amplifier of the receiver circuit in order to solve the above-mentioned problem.

SUMMARY OF THE INVENTION

However, if a variable delay circuit is provided on the input of the differential amplifier of the receiver circuit in order to control the skew as described in Patent Document 1, common mode noise which is added just before the receiver circuit is converted to differential noise by the differential amplifier. This reduces the effectiveness of common mode noise rejection by the differential amplifier. Especially, at the immediate upstream side of the receiver circuit, the signal is vulnerable to noise since the signal amplitude has reduced due to loss along the cable or board, resulting in a degenerated signal/noise ratio.

To solve the above-mentioned problem in transmitting a small amplitude digital signal at high rates of several hundred Mbps or higher over a pair of signal wires, the present invention provides a differential signaling system which is immune to common mode noise applied just before the receiver circuit. As well, the present invention provides a connectorized cable and an information processing apparatus each of which is provided with such a system.

The present invention provides a differential signaling system comprising: a driver circuit for transmitting a differential signal; a receiver circuit for receiving the differential signal; and two or more signal lines used to provide a link for the differential signal to be transmitted by the driver circuit and received by the receiver circuit, wherein the driver circuit gives an arbitrary time lag between the two signals which constitute the differential signal before transmitting them.

The driver circuit in the above-mentioned differential signaling system may comprise: a delay circuit which gives said arbitrary time lag between the two signals forming the differential signal; and two amplification circuits which respectively amplify and transmit the first and second signals of the differential signal.

Alternatively, the driver circuit in the above-mentioned differential signaling system may comprise: a flip flop circuit which receives a clock with some phase and gives; and two amplification circuits which, after said arbitrary time lag is given between the two signals forming the differential signal by the flip flop circuit, respectively amplify and transmit the two signals.

Alternatively, the driver circuit in the above-mentioned differential signaling system may be configured to separately output each of the two signals forming the differential signal to one of the two or more signal lines.

The receiver circuit in the above-mentioned differential signaling system may comprise: a differential amplifier which amplifies the received differential signal; a PLL circuit which generates two or more phase-different clocks; a clock signal recovery circuit which uses a phase comparator to compare the phase of the received signal with the phases of the PLL clocks and uses a selector to select a PLL clock; and a register circuit which retains the phase of the selected PLL clock.

Alternatively, the receiver circuit in the above-mentioned differential signaling system may comprise: a differential amplifier which amplifies the received differential signal; short circuits which respectively set the two inputs of the differential amplifier to the middle voltages of the signals; a PLL circuit which generates two or more phase-different clocks; a clock signal recovery circuit which uses a phase comparator to compare the phase of the received signal with the phases of the PLL clocks and uses a selector to select a PLL clock; and a register circuit which retains the phase of the selected PLL clock.

Alternatively, the receiver circuit in the above-mentioned differential signaling system may comprise: an amplification circuit which has two functions of amplifying the difference between the received two signals and separately amplifying each of the two received signals; a PLL circuit which generates two or more phase-different clocks; a clock signal recovery circuit which uses a phase comparator to compare the phase of the received signal with the phases of the PLL clocks and uses a selector to select a PLL clock; and a register circuit which retains the phase of the selected PLL clock.

The present invention also provides a method of controlling the skew between the signal lines of the above-mentioned differential signaling system, comprising: a first step in which the clock signal recovery circuit selects a recovered clock for one of the two signals transmitted from the driver circuit and received by the receiver circuit and stores the phase of the selected clock in the register; a second step in which the clock signal recovery circuit selects a recovered clock for the other phase-opposite one of the two signals transmitted from the driver circuit and received by the receiver circuit and stores the phase of the selected clock in the register; and a third step in which the phase difference between the phase of the recovered clock stored in the first step and the phase of the recovered clock stored in the second step is converted to a time lag, wherein the time lag calculated in the third step is set as said arbitrary time lag in the driver circuit.

The present invention also provides a connectorized cable comprising a transmission side connector and a reception side connector which are connected by a cable having two or more signal lines or a signal line, wherein the above-mentioned differential signaling system is provided.

The present invention also provides an information processing apparatus in which daughter boards having various processing functions are connected by two or more a cable having two or more signal lines or a signal line, wherein the above-mentioned differential signaling system is provided.

These and other objects, features and advantages of the invention will be apparent from the following more particular description of preferred embodiments of the invention, as illustrated in the accompanying drawings.

BRIEF DESCRIPTION OF THE DRAWINGS

FIG. 1 is a block diagram showing a differential signaling system according to a first embodiment of the present invention, which comprises a driver circuit and a receiver circuit and constitutes part of a connectorized cable, an information processing apparatus or the like.

FIG. 7 is a block diagram showing a differential signaling system according to a second embodiment of the present invention, which comprises a driver circuit and a receiver circuit and constitutes part of a connectorized cable, an information processing apparatus or the like.

FIG. 8 is a block diagram showing a differential signaling system according to a third embodiment of the present invention, which comprises a driver circuit and a receiver circuit and constitutes part of a connectorized cable, an information processing apparatus or the like.

FIG. 9 is a block diagram showing a differential signaling system according to a fourth embodiment of the present invention, which comprises a driver circuit and a receiver circuit and constitutes part of a connectorized cable, an information processing apparatus or the like.

FIG. 10 is a block diagram showing a differential signaling system according to a fifth embodiment of the present invention, which comprises a driver circuit and a receiver circuit and constitutes part of a connectorized cable, an information processing apparatus or the like.

DESCRIPTION OF THE PREFERRED EMBODIMENTS

By use of the accompanying drawings, the following will provide a description of embodiments of the present invention, including a differential signaling system which sends and receives a differential signal between a driver circuit and a receiver circuit therein and a connectorized cable and an information processing apparatus each of which is provided with such a system.

Embodiment 1

Figure 1:
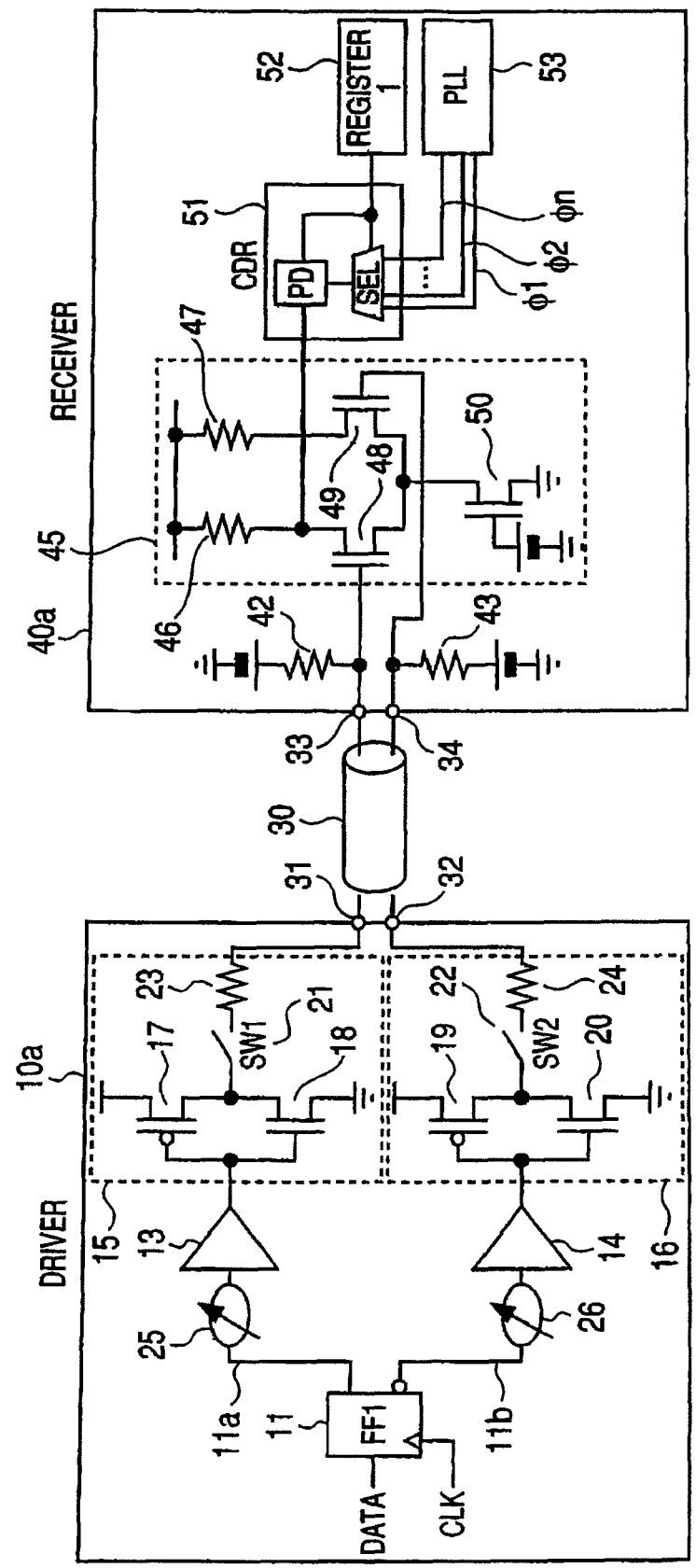

FIG. 1 is a circuit diagram showing a differential signaling system according to a first embodiment of the present invention, which comprises a driver circuit and a receiver circuit and constitutes part of a connectorized cables an information processing apparatus or the like.

The driver circuit 10a according to the first embodiment comprises: an output buffer 15; an output buffer 16; a preamplifier 13 for driving the output buffer 15; a preamplifier 14 for driving the output buffer 16; variable delay circuits 25 and 26; and a flip flop (FF) circuit 11 to which DATA and a CLK are input and which has an output 11a and an output 11b that is obtained by inversing the output 11a. The output buffer 15 comprises: a PMOS transistor 17 and a NMOS transistor 18 which are connected in series between a dc voltage and the ground; and a switch 21 and a termination resistor 23 which are connected in series between the drain of the PMOS transistor 17 or the drain of the NMOS transistor 18 and an output pin 31. Likewise, the output buffer 16 comprises: a PMOS transistor 19 and a NMOS transistor 20 which are connected in series between a dc voltage and the ground; and a switch 22 and a termination resistor 24 which are connected in series between the drain of the PMOS transistor 19 or the drain of the NMOS transistor 20 and an output pin 32. Thus, the driver circuit 10a has two delay circuits 25 and 26 and therefore can give arbitrary amounts of delay separately to one and the other signals of the differential signal before these signals are respectively amplified by the two amplification circuits (13 and 15) and (14 and 16) and outputted to the output pins 31 and 32 via the termination resistors 23 and 24 from the drain of the PMOS transistor 17 connected in series with the NMOS transistor 18 and the drain of the PMOS transistor 19 connected in series with the NMOS transistor 20.

The receiver circuit 40a according to the first embodiment comprises: a termination resistor 42 having one end connected to the input pin 33 and the gate of a NMOS transistor 48 and the other end connected to a dc voltage; a termination resistor 43 having one end connected to the input pin 34 and the gate of a NMOS transistor 49 and the other end connected to a dc voltage; a differential amplification circuit 45 comprising NMOS transistors 48 and 49 having their sources connected with each other so as to constitute a differential amplifier, resistors 46 and 47 which are respectively connected between a dc voltage and the drains of the NMOS transistors 48 and 49 and a NMOS transistor 50 which is provided between the ground and the sources of the NMOS transistors 48 and 49 so as to constitute a constant current source; a phase locked loop (PLL) circuit 53; a clock data recovery (CDR) circuit 51 in which a phase detection (PD) circuit compares the signal entered into the receiver with n phase-different clocks output from the phase locked loop (PLL) circuit 53 and a selector (SEL) circuit selects a clock which agrees in phase with the signal; and a register 52 which stores therein the phase selected by the CDR circuit. Thus, the receiver circuit 40a is constructed of: the differential amplifier 45 which amplifies the signal received from the input pins 33 and 34; the PLL circuit 53 which generates two or more phase-different clocks; the clock data recovery circuit 51 which uses its phase comparator to compare the received signal with the clocks from the PLL and uses its selector to select a clock; and the register circuit 52 which retains the phase of the selected PLL clock.

Further in the first embodiment, the output pins 31 and 32 of the driver circuit 10a are respectively connected with the input pins of the receiver circuit 40a for differential signaling by a pair of signal lines 30 contained in a cable or formed on the board.

Figure 2:
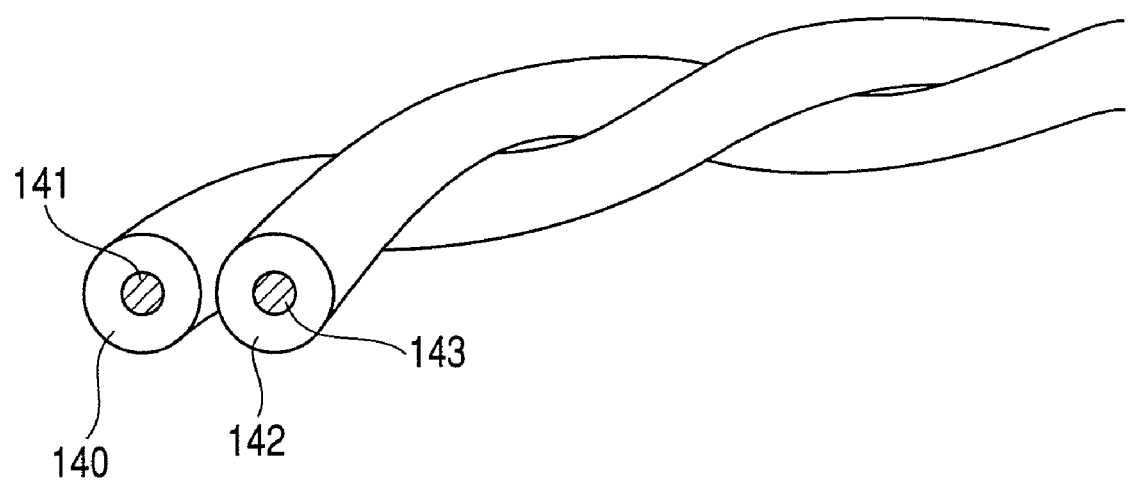
FIG. 2 shows a cable according to the present invention, which has two signal lines.
Figure 3:
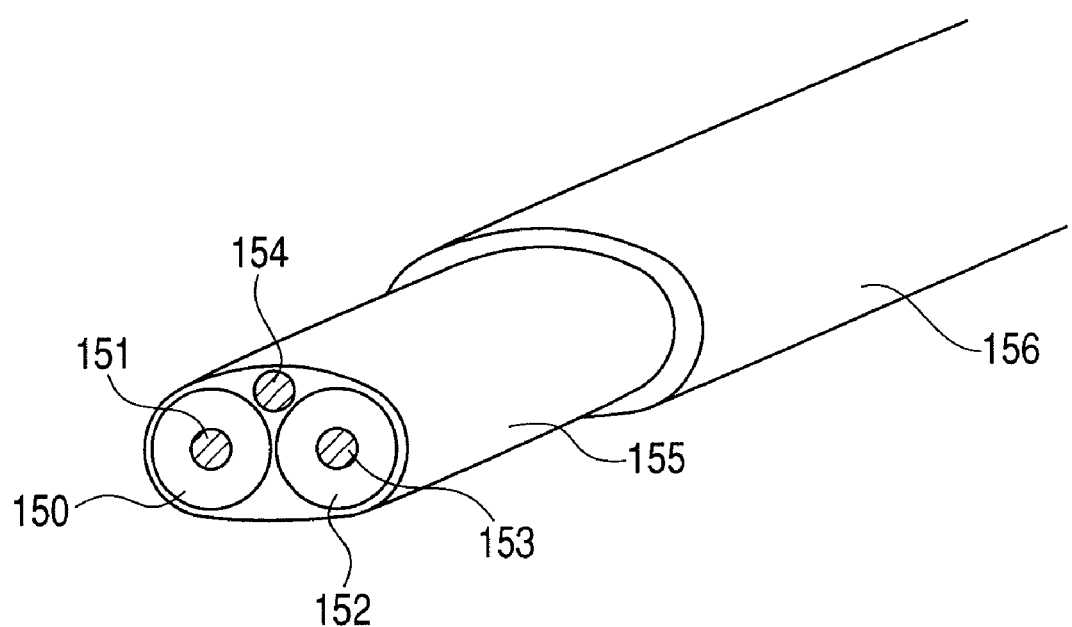
FIG. 3 shows another cable according to the present invention, which has two signal lines.

The cable may be a twisted pair cable having conductors 141 and 143 surrounded respectively with dielectric coatings 140 and 141 as shown in FIG. 2. As well, the cable may be a differential shielded cable as shown in FIG. 3 where conductors 151 and 153 surrounded respectively with dielectric coatings 151 and 152 and a drain wire 141 are covered with a shield 155 and then a protective coating 156. Further, the cable may be a coaxial pair cable as shown in FIG. 4 where conductors 161 and 162 are respectively surrounded by dielectric coatings 160 and 161 and then by shields 162 and 164.

Figure 4:
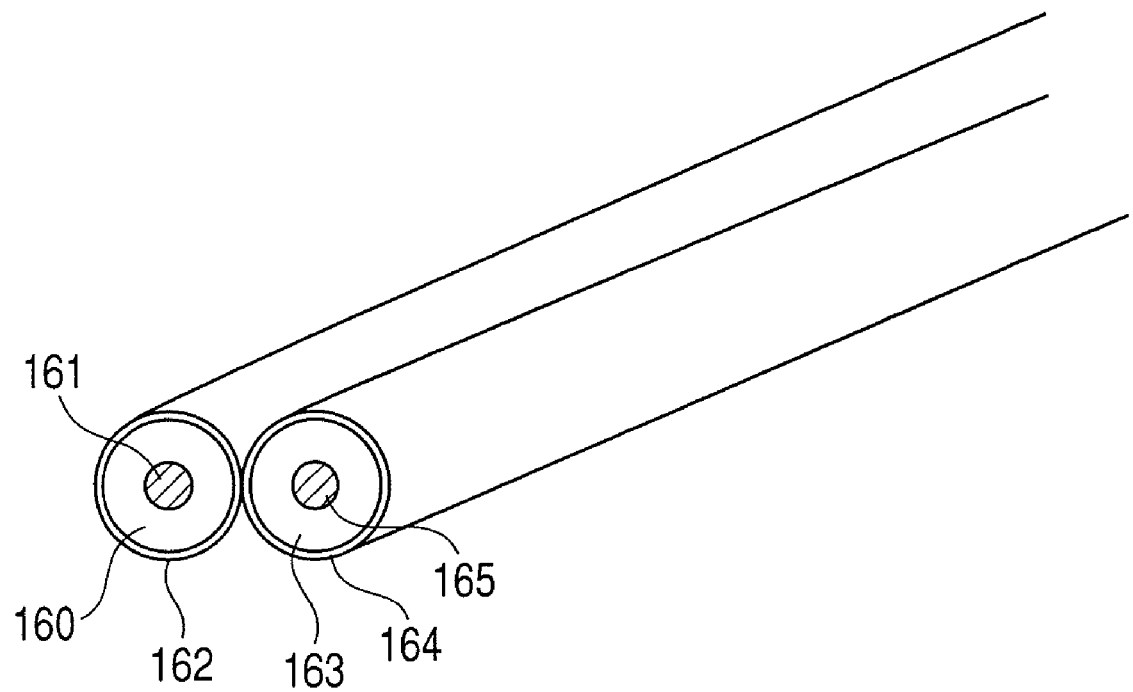
FIG. 4 shows yet another cable according to the present invention, which has two signal lines.

The present invention does not limit the differential signal transmission medium to those shown in FIGS. 2, 3 and 4. It is possible to use any cable containing a pair of signal lines or form the signal lines on the board.

Some signal arrival time difference (skew) occurs between the two signal lines since the signal propagation speed varies depending on such factors as the dielectric constant of the dielectric insulator which is subject to the process fluctuations. If substantial skew occurs within the pair of signal lines, the differential signal may be impossible to be transmitted. This is described below with reference to the waveforms shown in FIG. 5.

Figure 5:
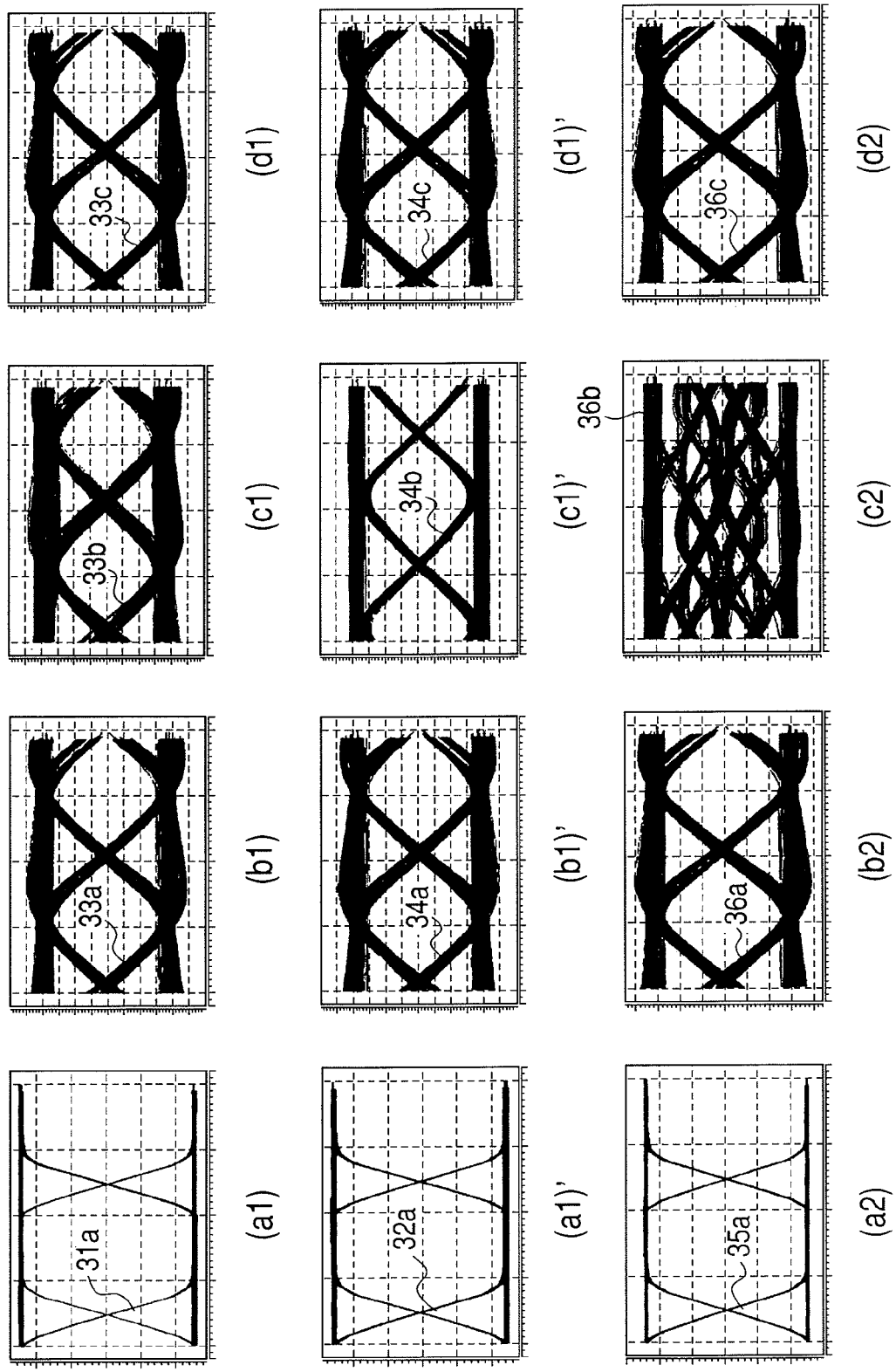
FIG. 5 shows waveform diagrams showing the effect of the present invention.

Each waveform shown in FIG. 5, called an eye pattern, is obtained by repeatedly depicting the signal waveform over each signal time period. The wider the eye opens, the transmission system is more immune to noise, allowing reliable transmission of the signal.

The waveform 31a shown in FIG. 5(a1) is obtained at the output pin 31 of the driver circuit. The waveform 32a in FIG. 5(a1)' is at the output pin 32 of the driver circuit. The waveform 35a shown in FIG. 5(a2) is a differential waveform representing their difference (31a-32a). Further, FIG. 5(b1) and FIG. 5(b1)' respectively show waveforms 33a and 34a obtained at the input pins 33 and 34 of the receiver circuit and FIG. 5(b2) shows a differential waveform 36a representing their difference 33a-34a.

In the case of FIG. 5(c1) and FIG. 5(c1)', the skew between the signal lines causes temporal misalignment between the waveform 33b at the input pin 33 of the receiver circuit and the waveform 34b at the input pin 34, resulting in an eye-closed differential waveform 36b shown in FIG. 5(c2) which indicates that signal transmission is impossible.

However, if the driver circuit and receiver circuit are constructed according to any of the first through fifth embodiments of the present invention, the variable delay circuits 25 and 26 or flip flop (FF) circuits 11 and 12 of the driver circuit 10 (10a~10d) can add such a time lag between the waveforms at the output pins 31 and 32 as to cancel the skew between the signal lines. Thus, it is possible to open the eye of the differential waveform 36c as shown in FIG. 5(d2) since the waveforms 33c and 34c at the input pins 33 and 34 of the receiver circuit 40 (40a~40c) are temporally aligned as shown in FIGS. 5(d1) and 5(d1)'. In addition, since the waveforms 33c and 34c at the input pins 33 and 34 of the receiver circuit 40 (40a~40c) are aligned, the differential amplification circuit 45 of the receiver can exert its common mode noise rejection ability. Thus, although the signal amplitude decreases due to loss along the cable or board, it is possible to suppress the signal/noise ratio deterioration.

Figure 6:
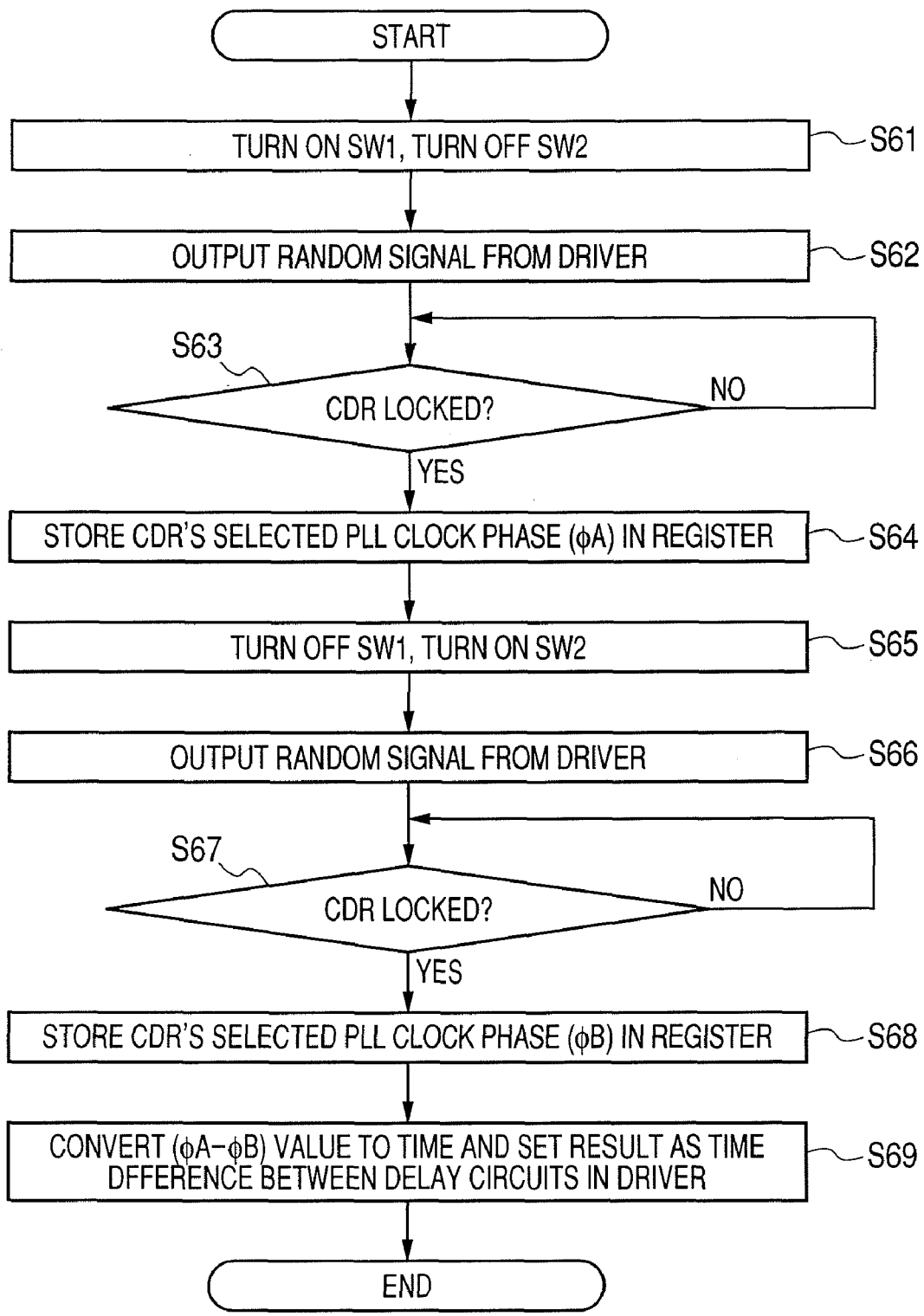
FIG. 6 is a flowchart showing a skew control procedure according to the present invention.

With reference to FIG. 6, the following provides a description of a method for controlling skew, a first example of a method for controlling the skew by using the driver circuit 10a and receiver circuit 40a in the first differential signaling system embodiment of the present invention.

Firstly, in the driver circuit 10a, the switch (SW1) 21 is turned on and the switch (SW2) 22 is turned off (S61). Then, a data-switching random signal is output from the driver circuit 10a for a certain amount of time (S62). If the CDR circuit 51 of the receiver circuit 40a is locked (S63), the detected phase φA is recorded in the register 52 (S64).

Then, in the driver circuit 10a, the switch (SW1) 21 is turned off and the switch (SW2) 22 is turned on (S65). Then, a data-switching random signal is output from the driver circuit 10a for a certain amount of time (S66). If the CDR circuit 51 of the receiver circuit 40a is locked (S67), the detected phase φB is recorded in the register 52 (S68).

The difference between phase φ1 and phase φ2 (φA-φB) corresponds to the signal arrival time difference (skew) between the two signal lines 30. This phase difference is converted to time and set as a time lag between the delay circuits 25 and 26 of the driver circuit 10a (S69).

Thus, a time lag can be set to between the waveforms at the output pins 31 and 32 so that the skew between the signal lines 30 is cancelled. Consequently, differential signaling is made possible with an eye-opened differential waveform as shown in FIG. 5(d2) since the waveforms 33c and 34c at the input pins 33 and 34 of the receiver circuit 40 (40a~40c) are temporally aligned as shown in FIGS. 5(d1) and 5(d1)'. In addition, since the waveforms 33c and 34c at the input pins 33 and 34 of the receiver circuit 40 (40a~40c) are aligned, the differential amplification circuit 45 (90) of the receiver can exert its common mode noise rejection ability. Thus, although the signal amplitude decreases due to loss along the cable or board, it is possible to suppress the signal/noise ratio deterioration.

Note that the signal which is transmitted for skew control is not limited to a random waveform. Instead, this signal may be a fixed pattern or a repletion of 1 and 0 if the CDR1 can be locked. Also note that when the skew control is done in the first embodiment, the receiver circuit 40a must send instructions to the driver circuit 10a to separately turn on/off the switches 21 and 22.

In substantially the same manner, the skew control method mentioned above as its first example may also be applied to the other differential signaling system embodiments described later.

Note that for regular signal transmission between the driver circuit 10a and receiver circuit 40a shown in FIG. 1, both switches 21 and 22 are turned on.

Second Embodiment

Figure 7:
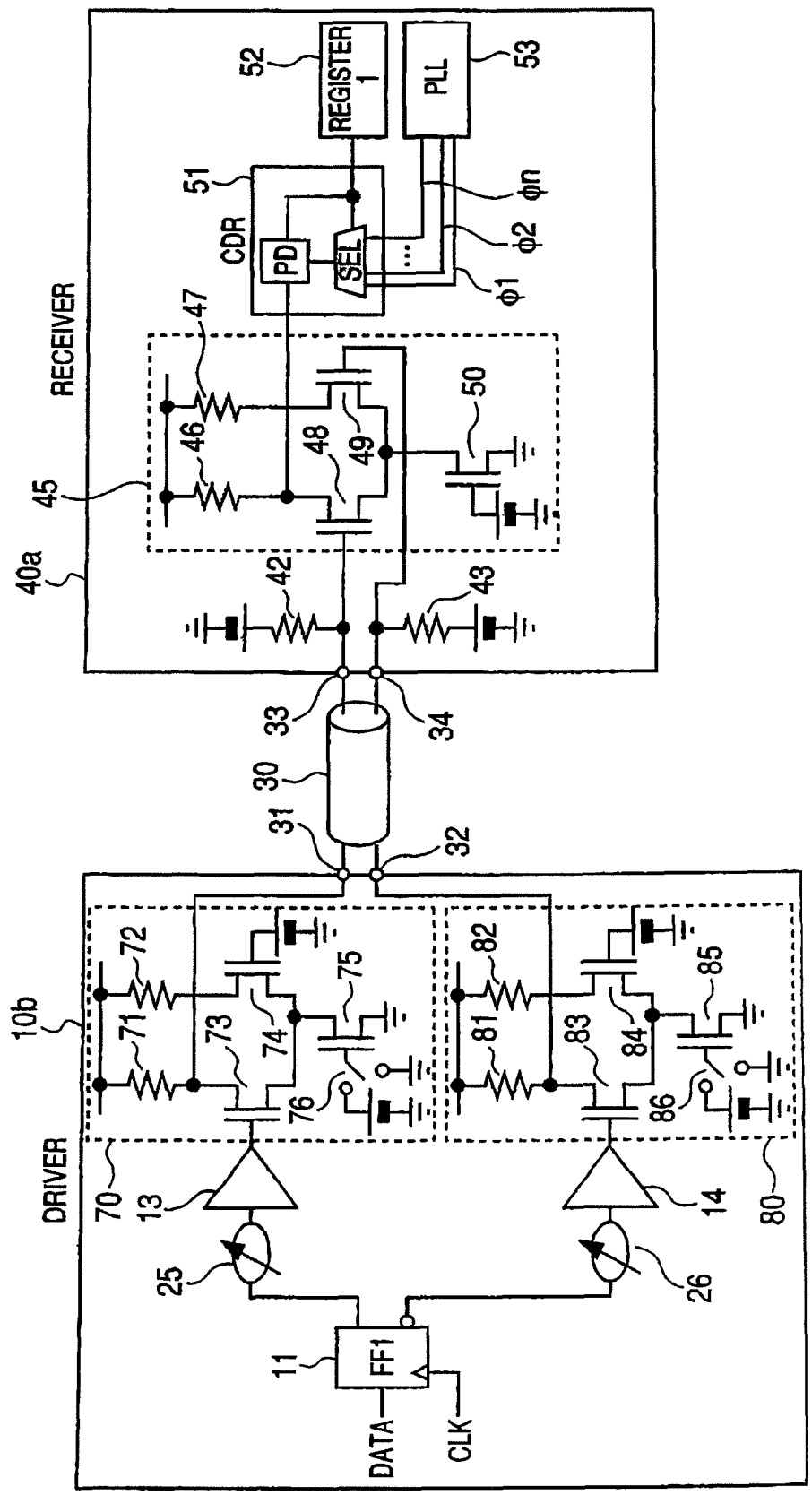

FIG. 7 is a circuit diagram showing a differential signaling system according to a second embodiment of the present invention, which comprises a driver circuit and a receiver circuit and constitutes part of a connectorized cable, an information processing apparatus or the like.

The driver circuit 10b of the second embodiment comprises: a differential output buffer 70; a differential output buffer 80; a preamplifier 13 for driving the output buffer 70; a preamplifier 14 for driving the output buffer 80; variable delay circuits 25 and 26; and a flip flop (FF) circuit 11 which receives an input DATA and an input CLK and provides an output 11a and an output 11b obtained by inversing the output 11a. The differential output buffer 70 comprises: NMOS transistors 73 and 74 whose sources are connected; resistors 71 and 72 which are respectively connected between the drains of the NMOS transistors 73 and 74 and a dc voltage; a NMOS transistor 75 which serves as a constant current source; and a switch 76 for switching the gate voltage of the NMOS transistor 75. The differential output buffer 80 comprises: NMOS transistors 83 and 84 whose sources are connected; resistors 81 and 82 which are respectively connected between the drains of the NMOS transistors 83 and 84 and a dc voltage; a NMOS transistor 85 which serves as a constant current source; and a switch 86 for switching the gate voltage of the NMOS transistor 85. Thus, the driver circuit 10b has two delay circuits 25 and 26 and therefore can give arbitrary amounts of delay separately to one and the other signals of the differential signal before these signals are respectively amplified by the two amplification circuits (13 and 15) and (14 and 16) and outputted to the output pins 31 and 32 from the drain of the NMOS transistor 73 whose gate is connected to the output of the preamplifier 13 and the drain of the NMOS transistor 83 whose gate is connected to the output of the preamplifier 14.

As described above, the driver circuit 10b according to the second embodiment is different from that of the first embodiment in that the differential output buffers 70 and 80 are provided in place of the output buffers 15 and 16. When controlling the signal arrival time difference (skew) between the two signal lines 30, the NMOS transistors 75 and 85 which serve as constant current sources are separately turned on or off by changing their gate voltages with the switches 76 and 86.

The receiver circuit 40a of the second embodiment has the same configuration as that of the first embodiment. That is, the receiver circuit 40a comprises: a differential amplifier 45 which amplifies the signal received from the input pins 33 and 34; a PLL circuit 53 which generates two or more phase-different clocks; a clock data recovery circuit 51 which uses its phase comparator to compare the received signal with the clocks from the PLL and uses its selector to select a clock; and a register circuit 52 which retains the phase of the selected PLL clock.

Note that to control the skew, two switch states must be used. The switch 76 is on and the switch 86 is off in one state while the switch 76 is off and the switch 86 is on in the other state. Also note that when the skew control is done in the second embodiment, the receiver circuit 40a must send instructions to the driver circuit 10b to separately turn on/off the switches 76 and 86.

As described above, when the skew control is done in the second embodiment, it is possible to use the switches 76 and 86 which are connected respectively to the gates of the NMOS transistors 75 and 85 which serve as constant current sources without deteriorating the output waveform of the driver circuit 10b.

For regular signal transmission, both switches 76 and 86 are turned on.

Third Embodiment

Figure 8:
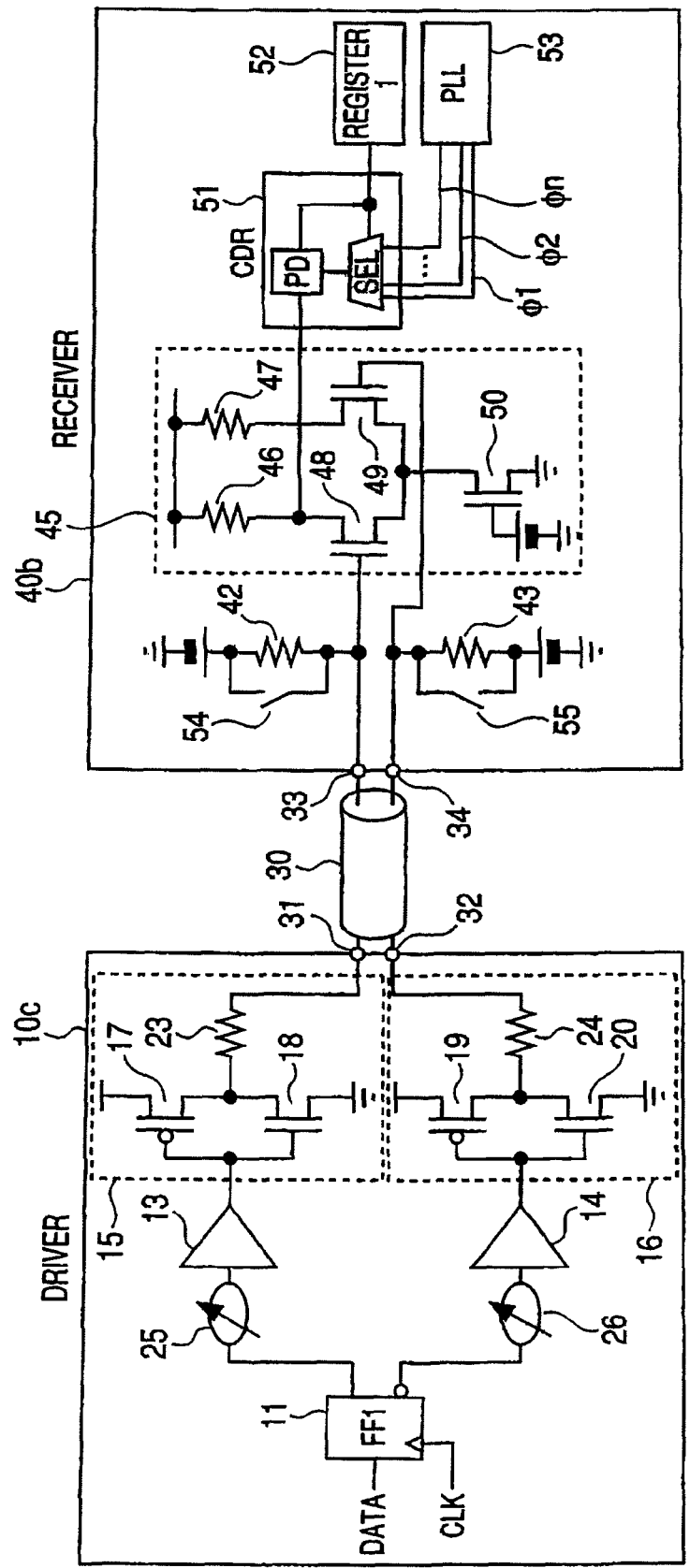

FIG. 8 is a circuit diagram showing a third differential signaling system embodiment of the present invention which comprises a driver circuit and a receiver circuit and constitutes part of a connectorized cable, an information processing apparatus or the like.

The driver circuit 10c comprises: an output buffer 15 comprising a PMOS transistor 17 and a NMOS transistor 18 which are connected in series and a termination resistor 23; an output buffer 16 comprising a PMOS transistor 19 and a NMOS transistor 20 which are connected in series and a termination resistor 24; a preamplifier 13 for driving the output buffer 15; a preamplifier 14 for driving the output buffer 16; variable delay circuits 25 and 26; and a flip flop (FF) circuit 11 to which DATA and a CLK are input and provides an output 11a and an output 11b obtained by inversing the output 11a. The output buffers 15 and 16 of the third embodiment may be constructed of differential output buffers such as those 70 and 80 of FIG. 7 not having switches 76 and 86.

That is, the driver circuit 10c of the third embodiment is different from the respective driver circuits 10a and 10b of the first and second embodiments in that the skew control switches 21 and 22 or 76 and 86 are not included.

Due to no skew control switches in the driver circuit, the receiver circuit 40b of the third embodiment is constructed by adding switches 54 and 55 to the receiver circuit 40a of the first embodiment so that the termination resistors 42 and 43 can be short-circuited. That is, these skew control switches 54 and 55 are respectively connected in parallel with the termination resistors 42 and 43.

To control the skew, two switch states must be used. The switch 54 is on and the switch 55 is off in one state while the switch 54 is off and the switch 55 is on in the other state.

As described above, when the skew control is done in the third embodiment, it is not necessary to send instructions from the receiver circuit 40b to the driver circuit 10c to turn on/off the switches 54 and 55. This can reduce the frequency of communication required to control the driver circuit 10 and receiver circuit 40.

For regular signal transmission, both switches 54 and 55 are turned off.

Fourth Embodiment

Figure 9:
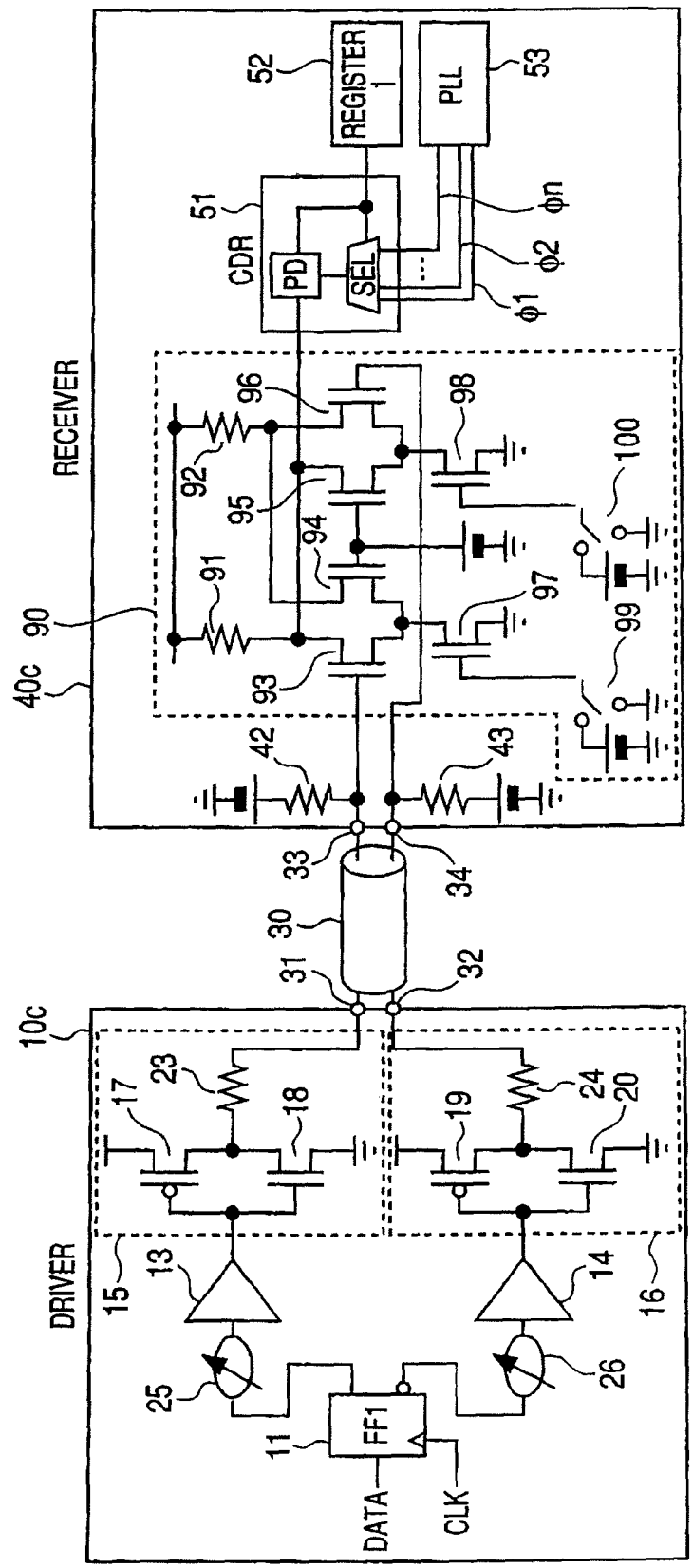

FIG. 9 is a circuit diagram showing a differential signaling system according to a fourth embodiment of the present invention which comprises a driver circuit and a receiver circuit and constitutes part of a connectorized cable, an information processing apparatus or the like.

The driver circuit 10c of the fourth embodiment has the same configuration as the driver circuit of the third embodiment. Not like the first and second embodiments, no skew control switches are included.

Due to lack of skew control switches in the driver circuit, the receiver circuit 40c of the fourth embodiment comprises: a termination resistor 42 having one end connected to the input pin 33 and the gate of a NMOS transistor 93 and the other end connected to a dc voltage; a termination resistor 43 having one end connected to the input pin 34 and the gate of a NMOS transistor 96 and the other end connected to a dc voltage; a differential amplification circuit 90; a phase locked loop (PLL) circuit 53; a clock data recovery (CDR) circuit 51 in which a phase detection (PD) circuit compares the signal entered into the receiver with n phase-different clocks output from the phase locked loop (PLL) circuit 53 and a selector (SEL) circuit selects a clock which agrees in phase with the signal; and a register 52 which stores therein the phase selected by the CDR circuit 51. The differential amplification circuit 90 comprises: NMOS transistors 93 and 94 having their sources connected with each other so as to constitute a first differential amplifier, NMOS transistors 95 and 96 having their sources connected with each other so as to constitute a second differential amplifier; a dc voltage connected (short-circuited) to the gates of the NMOS transistors 94 and 95 (to fix these gate voltages to the neutral input voltage of the first and second differential amplifiers); a resistor 91 connected to the drains of the NMOS transistors 93 and 95; a resistor 92 connected to the drains of the NMOS transistor 94 and 96; a NMOS transistor 97 which serves as a constant current source; a switch 99 for switching the gate voltage of the NMOS transistor 97; a NMOS transistor 98 which serves a constant current source; and a switch 100 for switching the gate voltage of the NMOS transistor 98. Thus, in place of the differential amplification circuit 45 of the first embodiment, the receiver circuit 40c of the fourth embodiment has the differential amplification circuit 90 comprising skew control-use switches 99 and 100 as well as: termination resistors 42 and 43; NMOS transistors 93 and 94 whose sources are connected to each other to constitute the first differential amplifier; NMOS transistors 95 and 96 whose sources are connected to each other to constitute the second differential amplifier; a resistor 91 connected to the drains of the NMOS transistors 93 and 95; a resistor 92 connected to the drains of the NMOS transistors 94 and 96; and NMOS transistors 97 and 98 which serve as constant current sources. To control the skew, two switch states must be used. The switch 99 is on and the switch 100 is off in one state while the switch 99 is off and the switch 100 is on in the other state.

As described above, the two signal lines in the fourth embodiment are terminated at both driver and receiver sides even when the skew control is done. Thus, since the signal output on one signal line or the signal induced on the other signal line due to crosstalk is not reflected, the skew control accuracy does not deteriorate.

For regular signal transmission, both switches 99 and 100 are turned on.

Fifth Embodiment

Figure 10:
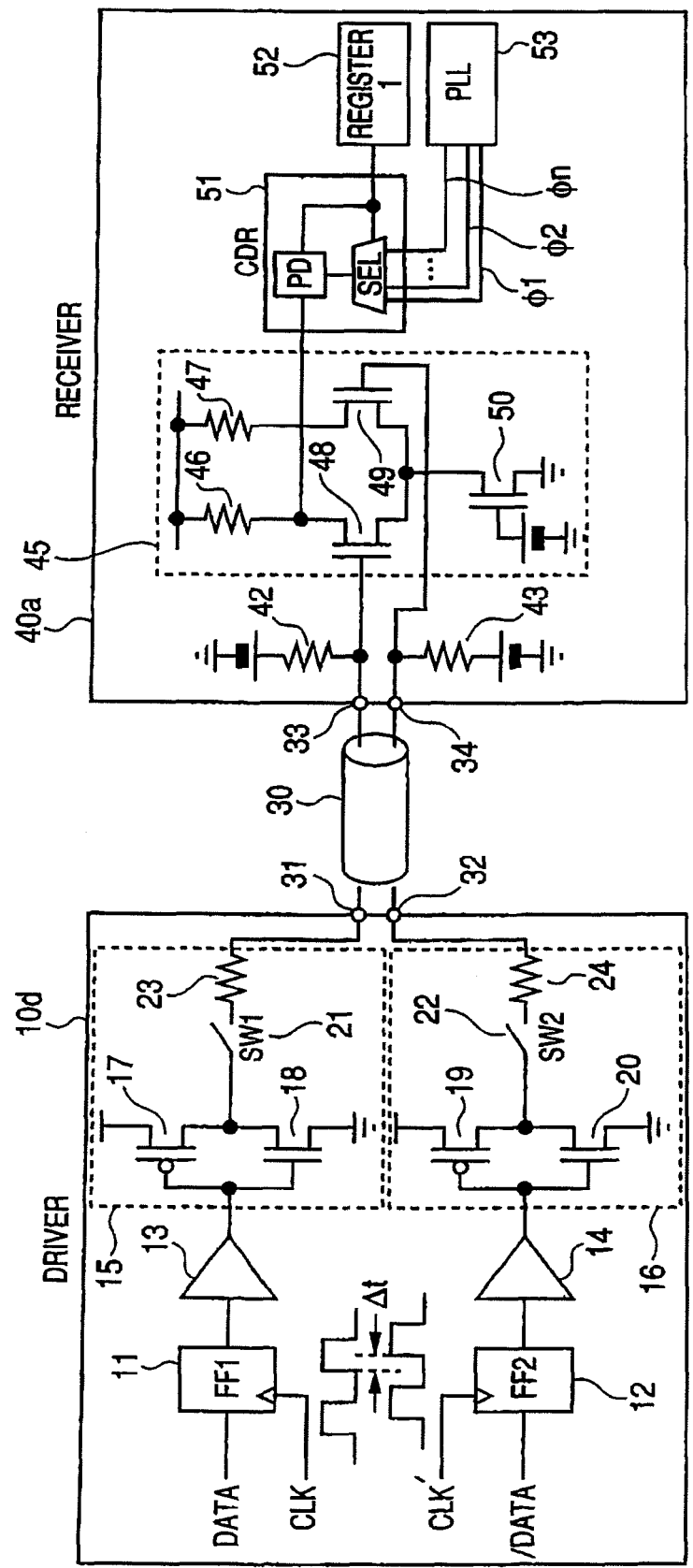

FIG. 10 is a circuit diagram showing a differential signaling system according to a fifth embodiment of the present invention which comprises a driver circuit and a receiver circuit and constitutes part of a connectorized cable, an information processing apparatus or the like.

The driver circuit 10d of the fifth embodiment comprises: an output buffer 15 composed of a PMOS transistor 17, a NMOS transistor 18, a switch 21 and a termination resistor 23; an output buffer 16 composed of a PMOS transistor 19, a NMOS transistor 20, a switch 22 and a termination resistor 24; a preamplifier 13 for driving the output buffer 15; a preamplifier 14 to drive the output buffer 16; a flip flop (FF) circuit 11 to which DATA and a CLK are input; and a flip flop (FF) circuit 12 to which /DATA (inversion of DATA) and CLK' (shifted by Δt from CLK). Thus, the driver circuit 10d of the fifth embodiment is different from the driver circuit 10a of the first embodiment in that the flip flop (FF) circuit 11 to which DATA and a CLK are input and the flip flop (FF) circuit (delay circuit) 12 to which DATA (inversion of DATA) and CLK' (shifted by Δt from CLK) are input are provided in place of the variable delay circuits 25 and 26. Since CLK' supplied to the FF circuit 12 can be shifted by an arbitrary amount of time Δt from CLK, it is possible to use the FF circuit 12 as a delay circuit to give an arbitrary time lag between one signal and the other signal of the differential signal. The output buffers 15 and 16 may employ the differential output buffers 70 and 80 shown in FIG. 7.

According to the fifth embodiment, CLK supplied to the FF circuit 11 and CLK' supplied to the FF circuit 12 can be generated from the multi-phase clock signal of the phase locked loop (PLL) circuit 10d. This can improve the time accuracy.

Sixth Embodiment

Figure 11:
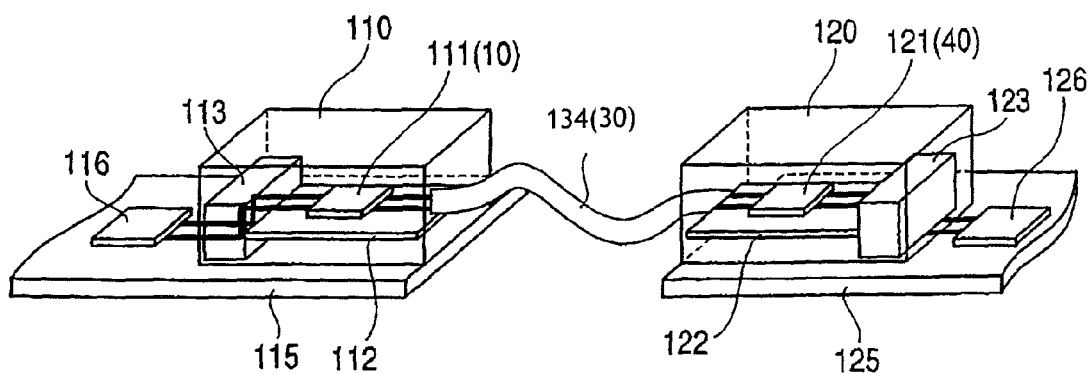
FIG. 11 shows the configuration of a connectorized cable according to the present invention.

With reference to FIG. 11, the following describes a connectorized cable according to a sixth embodiment of the present invention. FIG. 11 shows the configuration of the connectorized cable according to the present embodiment.

The connectorized cable (metal transceiver) of the present invention comprises a transmission side connector 110, a reception side connector 120 and a cable 130 (30). The transmission side connector 110 has a connector 113 by which a driver circuit 111 (10) and a board 112 having the driver circuit 111 (10) mounted thereon are detachably connected with a signal transmission side board 115 on which an IC circuit (processing logic) 116 and the transmission side connector 110 are mounted. The reception side connector 120 has a connector 123 by which a receiver circuit 121 (40) and a board 122 having the receiver circuit 121 (40) mounted thereon are detachably connected with a signal reception side board 125 on which an IC circuit (processing logic) 126 and the reception side connector 120 are mounted. To connect the transmission side connector 110 with the reception side connector 120, the cable 130 (30) has a pair of signal lines as shown in FIG. 2, 3 or 4. The cable 130 (30) is connected to the transmission side connector 110 and the reception side connector 120 by means of soldering or the like. The driver circuit 111 (10) and receiver circuit 121 (40) has a skew correction ability described with the first through fifth embodiments.

Note that the connectorized cable of the present invention may pluralize each of the driver circuit 111 (10), receiver circuit 121 (40) and pair cable 121 (30).

In addition, a single connectorized cable may be configured to provide bidirectional transmission. In this case, each side has one driver circuit 111 (10) and one receiver circuit 121 (40) mounted thereon. Two cables 130 (30) each having a pair of signal lines are provided. One cable connects one driver circuit 111 (10) and one receiver circuit 121 (40) between the opposite sides. The other cable connects the other driver circuit 111 (10) and the other receiver circuit 121 (40).

Seventh Embodiment

Figure 12:
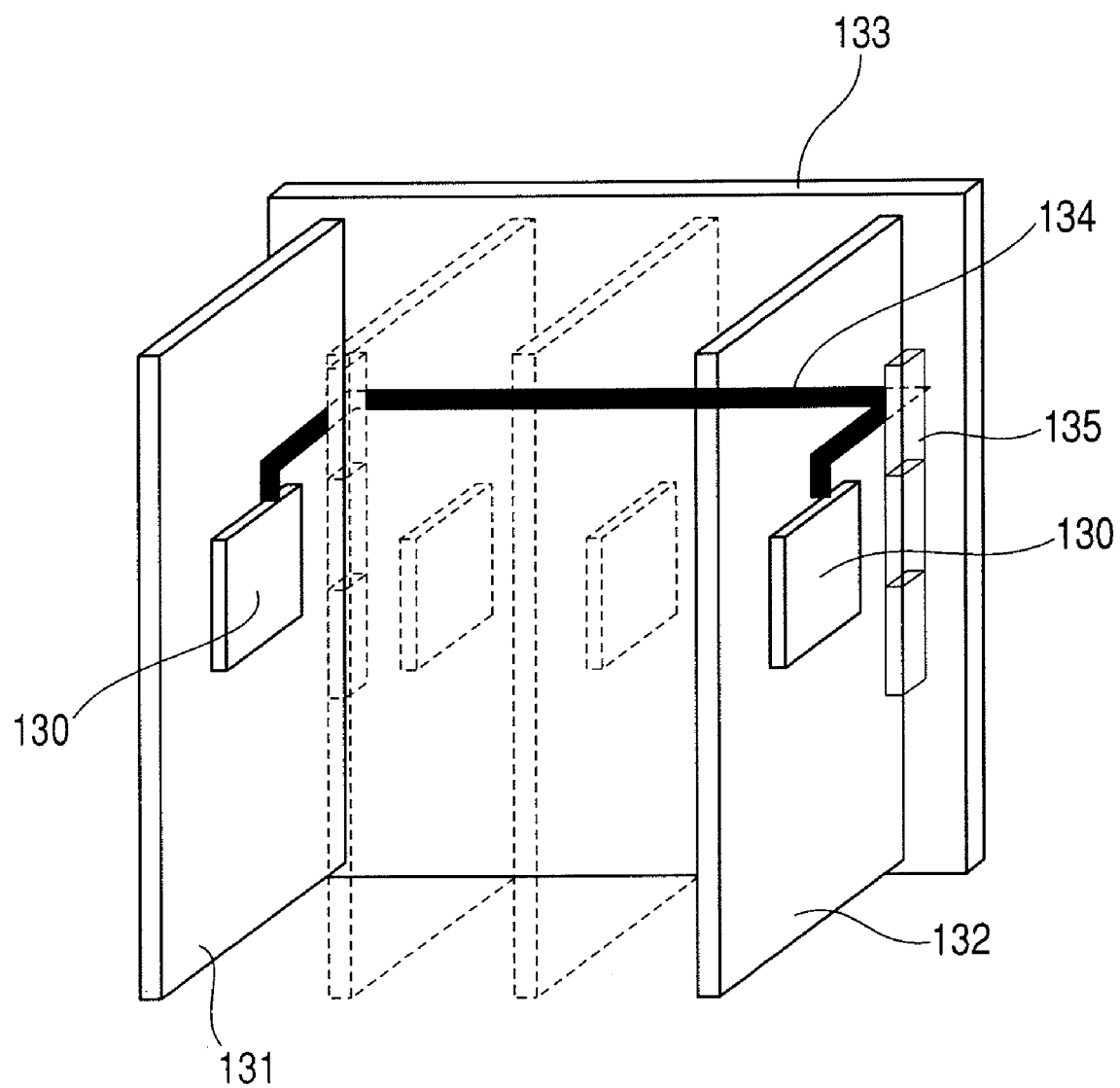
FIG. 12 shows the configuration of an information processing apparatus according to an embodiment of the present invention.
Figure 13:
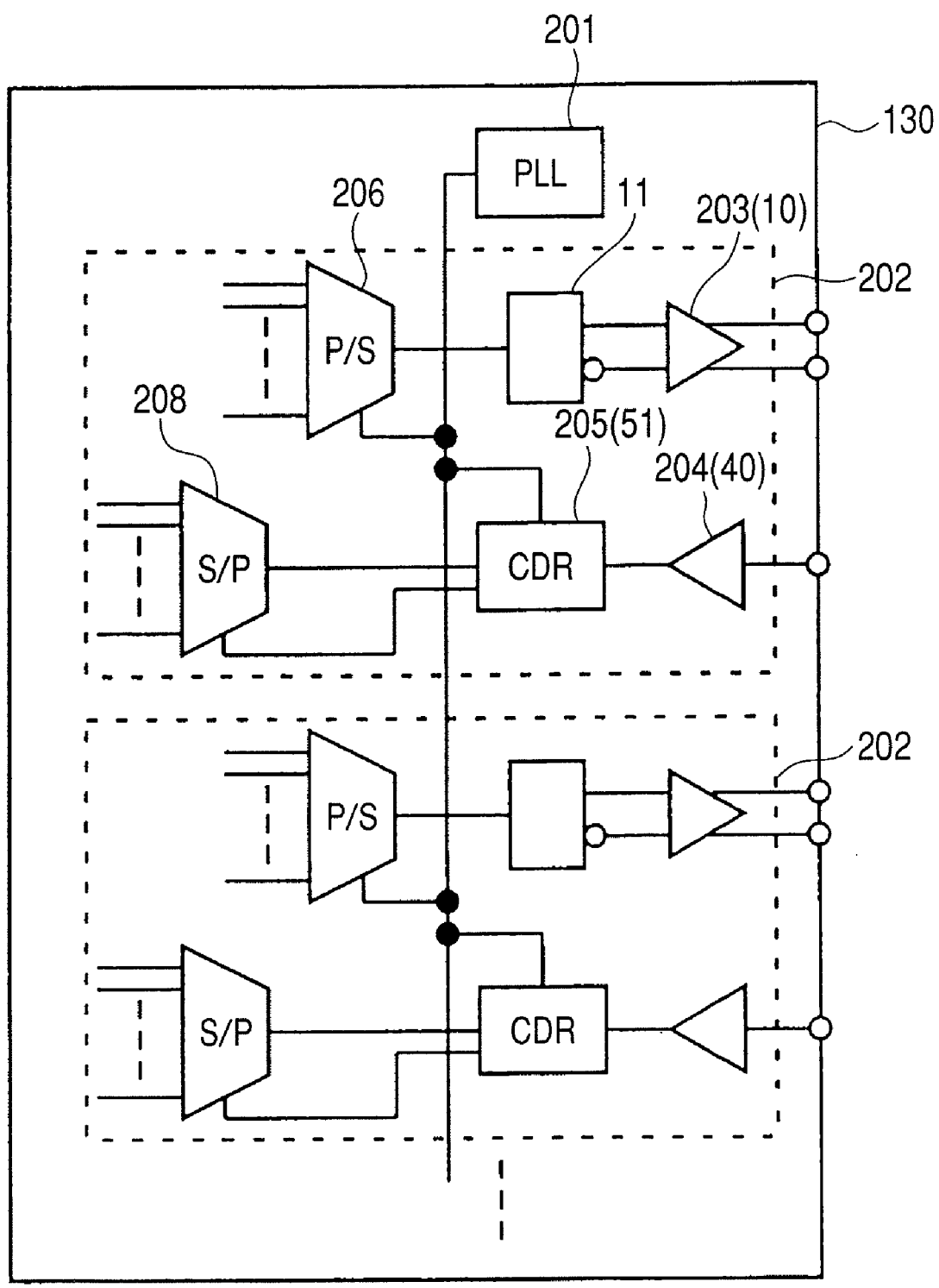
FIG. 13 is a block diagram of an IC which is mounted in information processing apparatus or the like according to the present invention.

With reference to FIGS. 12 and 13, the following provides a description of an information processing apparatus according to a seventh embodiment of the present invention. FIG. 12 shows the configuration of the information processing apparatus according to the seventh embodiment of the present invention.

The information processing apparatus according to the seventh embodiment of the present invention comprises: daughter boards 131 and 132 where plural ICs 130 having a driver circuit 10, receiver circuit 40 and other various functions are mounted; a mother board 133 for supplying power to the plural daughter boards and connecting the daughter boards by signal lines 134; and connectors 130 for connecting the daughter boards 131 and 132 to the mother board 133.

Each of the ICs 130, as shown in FIG. 13, has a phase locked loop (PLL) circuit 201 (53) to generate an internal clock (CLK) of the IC and a plurality of transceiver circuits 202. Each transceiver circuit 202 comprises: a parallel/serial conversion circuit (P/S circuit) 206 for converting a parallel signal to serial data (DATA) for transmission; a driver circuit 203 (10) for sending the serial data as a differential signal to a cable 134 (30) having a pair of signal lines; a receiver circuit 204 (40) for receiving a differential signal via a cable 134 (30): a CDR circuit 205 (51); and a serial/parallel conversion circuit (S/P circuit) 208 for converting the received serial data to a parallel signal. Outgoing serial data (DATA) obtained by a parallel/serial conversion circuit 206 and the clock (CLK) generated by the PLL circuit 201 (53) are concurrently entered into, for example, a FF circuit 11. A differential signal is output from the FF circuit 11. Since the difference between phase φ1 and phase φ2 (φA−φB) which corresponds to the signal arrival time difference (skew) between the two signal lines 30 is converted to a time lag and set between, for example, delay circuits 25 and 26 or between FF circuits 11 and 12, namely CLK and CLK', there appears no time difference between the waveforms observed respectively at input pin 33 and 34 of the destination receiver circuit 204 (40) as shown in FIGS. 5(d1) and (d1)'. This opens the eye of the differential waveform 36c as shown in FIG. 5(d2), enabling reliable differential signaling to the receiver circuit 204 (40). In addition, since the waveforms at the input pins 33 and 34 of the receiver circuit 40 are aligned, the differential amplification circuit 45 or 90 of the receiver can exert its common mode noise rejection ability. Thus, although the signal amplitude decreases due to loss along the cable and board, it is possible to suppress the signal/noise ratio deterioration. That is, driver circuits 203 (10) and receiver circuits 204 (40) provided in the ICs 130 mounted on the daughter boards 131 and 132 have skew correction ability as described with the first through fifth embodiments.

According to the above-described information processing apparatus according to the embodiment of the present invention, it is possible to reliably transmit a differential signal as data between daughter boards even if skew occurs between the two signal lines 137 which are formed on the boards and contained in the cable between the connectors 136.

In addition, according to the above-described information processing apparatus embodiment of the present invention, the two signal lines 137 which are formed on the boards and contained in the inter-connector cable are not required to have strictly the same length. This can lower the cost of the apparatus.

Eighth Embodiment

Figure 14:
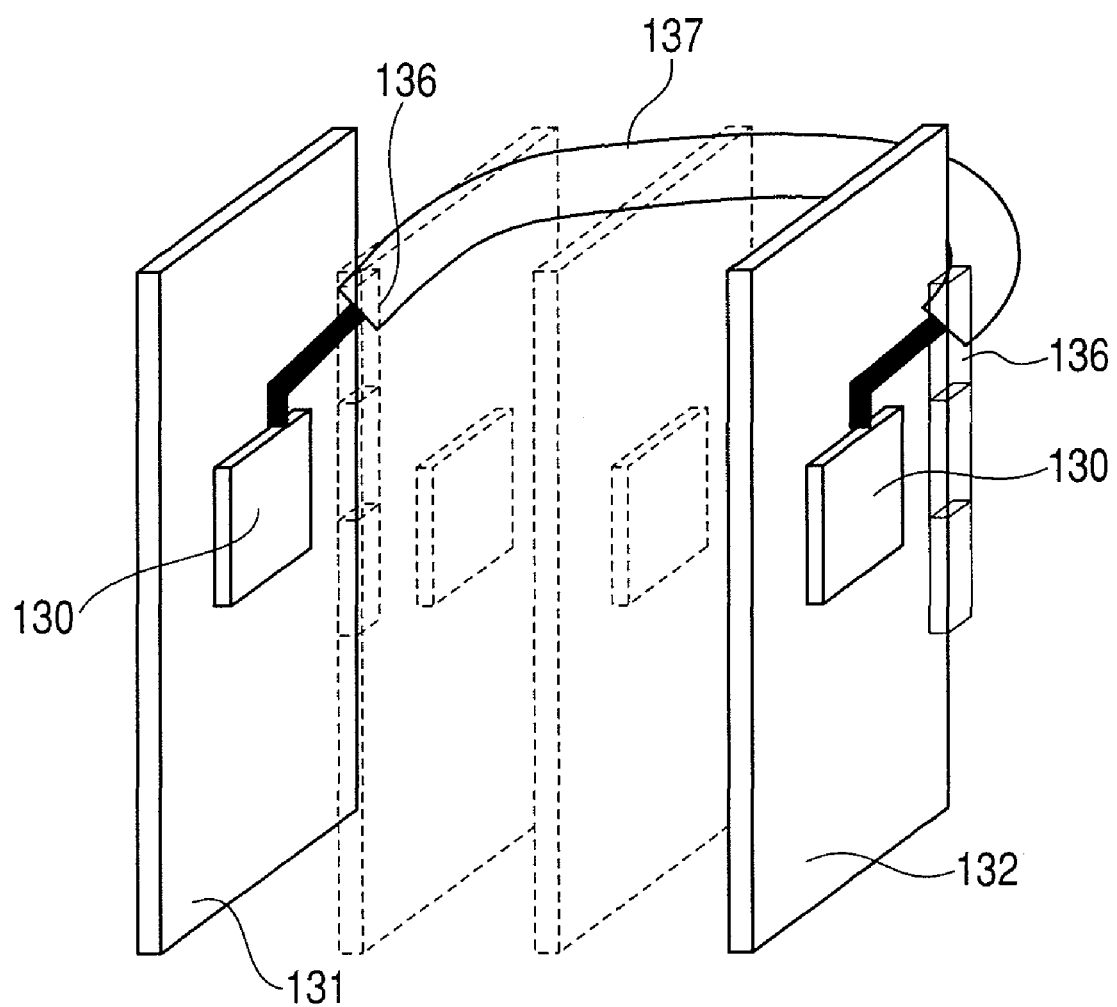
FIG. 14 shows the configuration of an information processing apparatus according to another embodiment of the present invention.

With reference to FIGS. 14 and 13, the following provides a description of FIG. 14 showing the configuration of an information processing apparatus according to an eighth embodiment of the present invention.

The information processing apparatus according to the eighth embodiment of the present invention comprises: daughter boards 131 and 132 where plural ICs 130 having a driver circuit 10, receiver circuit 40 and other various functions are mounted; plural cables 137 each of which carries two signal lines as shown in FIGS. 3 and 4; and connectors 136 for connecting the daughter boards 131 and 132 with each other by the cables 137.

Each of the ICs 130 mounted on the daughter boards 131 and 132 is configured as shown in FIG. 13. Thus, the driver circuits 203 (10) and receiver circuits 204 (40) provided in the ICs 130 mounted on the daughter boards 131 and 132 have a skew correction ability described with the first through fifth embodiments.

Similar to the embodiment shown in FIG. 12, according to the above-described information processing apparatus embodiment of the present invention, it is possible to reliably transmit a differential signal as data between daughter boards even if skew occurs between the two signal lines 137.

The following provides a description of major applications and advantages of the present invention disclosed so far in the present specification.

The present invention is applicable to ICs which use signal line pairs to transmit signals and connectorized cables and information processing apparatus which use these ICs.

According to the present invention, since a skew compensation time lag is given to between the two signals forming a differential signal before the differential signal is transmitted from a driver circuit, it is possible to reduce the skew appearing between the two signals received by the destination receiver circuit. It is therefore possible to effectively reject the common mode noise by the differential amplifier provided in the receiver circuit.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A differential signaling system comprising:
a driver circuit for transmitting a differential signal; and
a receiver circuit for receiving the differential signal,
wherein at least two signal lines are used for the differential signal to be transmitted by the driver circuit and received by the receiver circuit; and
wherein the driver circuit includes:
a flip flop circuit which outputs two signals which have mutually different phases;
a first time delay circuit which receives one of the two signals from the flip chip circuit and which variably controls a delay time of the received signal;
a second time delay circuit which receives the other of the two signals output from the flip chip circuit and which variably controls a delay time of the received signal;
a first amplifier which receives an output from said first time delay circuit;
a second amplifier which receives an output from said second time delay circuit;
a first output buffer which receives an output from the first amplifier;
a second output buffer which receives an output from the second amplifier;
a first output pin which receives an output from the first output buffer; and
a second output pin which receives an output from the second output buffer,
wherein said first time delay circuit and said second time delay circuit are adjustable in time lag between a waveform output from the first output pin and a waveform output from the second output pin so as to cancel skew between the signal lines.

2. The differential signaling system according to claim 1, wherein the receiver circuit further comprises: a differential amplifier which amplifies the received differential signal; a PLL circuit which generates two or more phase-different clocks;
a clock signal recovery circuit which uses a phase comparator to compare the phase of the received signal with the phases of the PLL clocks and uses a selector to select a PLL clock; and a register circuit which retains the phase of the selected PLL clock.

3. The differential signaling system according to claim 1, wherein the receiver circuit further comprises: a differential amplifier which amplifies the received differential signal; short circuits which respectively set the two inputs of the differential amplifier to the neutral voltages of the signals; a PLL circuit which generates two or more phase-different clocks; a clock signal recovery circuit which uses a phase comparator to compare the phase of the received signal with the phases of the PLL clocks and uses a selector to select a PLL clock; and a register circuit which retains the phase of the selected PLL clock.

4. The differential signaling system according to claim 1, wherein the receiver circuit further comprises: an amplification circuit which has two functions of amplifying the difference between the received two signals and separately amplifying each of the two received signals; a PLL circuit which generates two or more phase-different clocks; a clock signal recovery circuit which uses a phase comparator to compare the phase of the received signal with the phases of the PLL clocks and uses a selector to select a PLL clock; and a register circuit which retains the phase of the selected PLL clock.

5. A connectorized cable comprising a transmission side connector and a reception side connector which are connected by a cable having two or more signal lines or a signal line, wherein a differential signaling system according to claim 1 is provided.

6. A differential signaling system according to claim 1, wherein the driver circuit includes first and second switches controlled to be alternately switched by a data switching random signal so that the first switch is ON when the second switch is OFF and the second switch is ON when the first switch is OFF, wherein the first switch is coupled to provide one of the two signals constituting the differential signal and the second switch provides the other of the two signals constituting the differential signal, to thereby generate phase signals between the at least two signal lines corresponding to signal arrival time differences (skew) between the two signal lines, and wherein the receiver includes a register to record the phase signals.

7. A differential signaling system according to claim 6, wherein the driver circuit further includes first and second delay circuits, respectively coupled to the first and second switches, wherein the difference between the phase signals stored in the register is converted to time to indicate time lag between the first and second delay circuits.

8. A method for controlling skew on signal lines in the differential signaling system comprising:
a driver circuit for transmitting a differential signal; and
a receiver circuit for receiving the differential signal,
wherein at least two signal lines are used for the differential signal to be transmitted by the driver circuit and received by the receiver circuit; and
wherein the driver circuit transmits to the receiver circuit two signals which constitute the differential signal and which have an arbitrary time lag to control skew between the signal lines,
wherein the receiver circuit further comprises: a differential amplifier which amplifies the received differential signal; a PLL circuit which generates two or more phase-different clocks; a clock signal recovery circuit which uses a phase comparator to compare the phase of the received signal with the phases of the PLL clocks and uses a selector to select a PLL clock; and a register circuit which retains the phase of the selected PLL clock,
said method comprising:
a first step in which the clock signal recovery circuit selects a recovered clock for one of the two signals transmitted from the driver circuit and received by the receiver circuit and stores the phase of the selected clock in the register;
a second step in which the clock signal recovery circuit selects a recovered clock for the other phase-opposite one of the two signals transmitted from the driver circuit and received by the receiver circuit and stores the phase of the selected clock in the register; and
a third step in which the phase difference between the phase of the recovered clock stored in the first step and the phase of the recovered clock stored in the second step is converted to a time lag, wherein
the time lag calculated in the third step is set as said arbitrary time lag in the driver circuit.

9. An information processing apparatus comprising:
a driver circuit for transmitting a differential signal,
a receiver circuit for receiving the differential signal, and
at least two signal lines being used for the differential signal to be transmitted by the driver circuit and received by the receiver circuit,
wherein the driver circuit includes:
a flip flop circuit which outputs two signals which have mutually different phases;
a first time delay circuit which receives one of the two signals from the flip chip circuit and which variably controls a delay time of the received signal;
a second time delay circuit which receives the other of the two signals output from the flip chip circuit and which variably controls a delay time of the received signal;
a first amplifier which receives an output from said first time delay circuit;
a second amplifier which receives an output from said second time delay circuit;
a first output buffer which receives an output from the first amplifier;
a second output buffer which receives an output from the second amplifier;
a first output pin which receives an output from the first output buffer; and
a second output pin which receives an output from the second output buffer, wherein said first time delay circuit and said second time delay circuit are adjustable in time lag between a waveform output from the first output pin and a waveform output from the second output pin so as to cancel skew between the signal lines.

10. The information processing apparatus according to claim 9, wherein the receiver circuit further comprises: a differential amplifier which amplifies the received signal; a PLL circuit which generates two or more phase-different clocks; a clock signal recovery circuit which uses a phase comparator to compare the phase of the received signal with the phases of the PLL clocks and uses a selector to select a PLL clock; and a register circuit which retains the phase of the selected PLL clock.

11. The information processing apparatus according to claim 9, wherein the receiver circuit further comprises: a differential amplifier which amplifies the received differential signal; short circuits which respectively set the two inputs of the differential amplifier to the neutral voltages of the signals; a PLL circuit which generates two or more phase-different clocks; a clock signal recovery circuit which uses a phase comparator to compare the phase of the received signal with the phases of the PLL clocks and uses a selector to select a PLL clock; and a register circuit which retains the phase of the selected PLL clock.

12. The information processing apparatus according to claim 9, wherein the receiver circuit further comprises: an amplification circuit which has two functions of amplifying the difference between the received two signals and separately amplifying each of the two received signals; a PLL circuit which generates two or more phase-different clocks; a clock signal recovery circuit which uses a phase comparator to compare the phase of the received signal with the phases of the PLL clocks and uses a selector to select a PLL clock; and a register circuit which retains the phase of the selected PLL clock.

13. An information processing apparatus according to claim 9,
   wherein the driver circuit includes first and second switches controlled to be alternately switched by a data switching random signal so that the first switch is ON when the second switch is OFF and the second switch is ON when the first switch is OFF, wherein the first switch is coupled to provide one of the two signals constituting the differential signal and the second switch provides the other of the two signals constituting the differential signal, to thereby generate phase signals between the at least two signal lines corresponding to signal arrival time differences (skew) between the two signal lines, and wherein the receiver includes a register to record the phase signals.

14. An information processing apparatus according to claim 13,
   wherein the driver circuit further includes first and second delay circuits, respectively coupled to the first and second switches, wherein the difference between the phase signals stored in the register is converted to time to indicate time lag between the first and second delay circuits.

* * * * *